United States Patent [19]
Uenaka et al.

[11] Patent Number: 5,299,940
[45] Date of Patent: Apr. 5, 1994

[54] IC CARD

[75] Inventors: Takeshi Uenaka, Sandra City; Hajime Maeda, Itami; Yasumori Ikeda, Itami; Toru Tachikawa, Itami; Shigeo Onoda, Itami, all of Japan

[73] Assignee: Mitsubishi Denki Kabushiki Kaisha, Tokyo, Japan

[21] Appl. No.: 913,042

[22] Filed: Jul. 14, 1992

[51] Int. Cl.$^5$ .............................. H01R 7/10
[52] U.S. Cl. ........................... 439/76; 235/492
[58] Field of Search ............... 439/76; 361/392, 395, 361/399; 235/487, 488, 492

[56] References Cited

U.S. PATENT DOCUMENTS

| | | | |
|---|---|---|---|
| 4,729,061 | 3/1988 | Brown | 361/401 |
| 4,780,791 | 10/1988 | Morita et al. | 361/395 |
| 5,153,818 | 10/1992 | Mukougawa et al. | 439/86 |

Primary Examiner—Neil Abrams
Attorney, Agent, or Firm—Oblon, Spivak, McClelland, Maier & Neustadt

[57] ABSTRACT

An IC card is disclosed which would not be deformed, and hence, which maintains its quality reliability. A frame is provided to house a substrate which mounts ICs. Panels for protecting the ICs are fixed to the frame by first adhesive material layers. A connector is disposed, in contact with the substrate, between the panels. The connector is fixed to the frame by a second adhesive material layer. This prohibits that external force which acts on the connector at insertion and detachment of the IC card into and from external equipment from acting on the first adhesive material layers. Hence, insertion and detachment of the IC card do not cause deterioration in adhesion between the panels and the frame. Thus, deformation of the ICs due to the external force is prevented, thereby the quality reliability of the IC card being better maintained.

6 Claims, 5 Drawing Sheets 5,299,940

IC CARD

BACKGROUND OF THE INVENTION

1. Field of the Invention

The present invention relates to an IC card which is connected to external equipment by a connector of a two-piece or other type.

2. Description of the Background Art

FIGS. 1 to 3 show the structure of a conventional IC card with a two-piece type connector. A two-piece type connector is an indirect type connector used for a printed circuit board. Indirect type connectors connect a male or a female connector which is attached to a conductive part of a printed circuit board with a connector which is attached to another external device or external equipment. In FIGS. 1 to 3, indicated at 1 is a box like frame to house a circuit substrate 2 for mounting ICs. Indicated at 3 are panels for protecting ICs 5 against environmental disturbances from outside. The panels 3 are fixed to the frame 1 by adhesive sheets 4 so that the panels 3 and the circuit substrate 2 are in an opposed relation. A connector, indicated at 6, is disposed between the panels 3 and connected to the circuit substrate 2. The connector 6 is a two-piece type connector, for example.

Electrical connection between the IC card structured as above and external equipment (not shown) is ensured by the connector 6. In actual use, the IC card is inserted to and detached from the external equipment.

The conventional IC card requires that the connector 6 is fixed to the frame 1 by the adhesive sheets 4 which also fixes the panels 3 to the frame 1. When the IC card is inserted to or detached from the external equipment, this structure causes external force to act on the adhesive sheets 4 through the connector 6. The external force adversely affects the adhesion between the frame 1 and the panels 3, and further, deforms the IC card. Hence, deterioration in quality could result in the conventional IC card.

SUMMARY OF THE INVENTION

An IC card according to an aspect of the present invention comprises: a substrate for mounting ICs; a frame for housing the substrate, the frame comprising an open-side portion and a closed-side portion., two panels for protecting the substrate from two sides, the two panels being fixed to the frame by first adhesive material layers; a connector disposed inside the open-side portion and between the two panels, a front end of the connector being exposed outside of the IC card, a rear end of the connector being connected to the substrate within the IC card; and a second adhesive material layer for fixing the connector to the frame.

The ICs may be mounted to the both surfaces of the substrate.

Preferably, an adhesive material supporting member for supporting the second adhesive material layer is disposed in a lower portion of the closed-side portion of the frame.

The adhesive material supporting member may have a recessed portion in which the second adhesive material layer is to be placed.

In an aspect, the connector has projections and the open-side portion has recesses. The projections are engaged with the recesses.

The connector may be a two-piece type connector.

An IC card according to another aspect of the present invention comprises: a substrate for mounting ICs; a frame for housing the substrate, the frame comprising an open-side portion and a closed-side portion; a panel for protecting the substrate, the panel being fixed to the frame by first adhesive material layer opposite to the bottom portion of the frame; a connector disposed inside the open-side portion, a front end of the connector being exposed to outside of the IC card, a rear end of the connector being connected to the substrate within the IC card. The connector facing the panel; and a second adhesive material layer for fixing the connector to the frame.

The ICs may be mounted to the both surfaces of the substrate.

Preferably, an adhesive material supporting member for supporting the second adhesive material layer is disposed in a lower portion of the closed-side portion of the frame.

The adhesive material supporting member may have a recessed portion in which the second adhesive material layer is to be placed.

In an aspect, the connector has projections and the open-side portion has recesses. The projections are engaged with the recesses.

The connector may be a two-piece type connector.

Thus, in the IC card comprising the frame for housing the substrate mounting the ICs, the panels which are fixed to the frame by the first adhesive material layers and which protect the ICs mounted to the substrate, and the connector which is disposed between the panels and connected to the substrate, the connector is fixed to the frame by the second adhesive material layer. Hence, external force which acts on the connector at insertion and detachment of the IC card into and from external equipment is prevented from acting on the first adhesive material layers, and therefore, it follows that insertion and detachment of the IC card do not invite decline in the adhesion between the panels and the frame. Thus, the ICs would not be deformed due to the external force, thereby better maintenance of the quality reliability of the IC card being achieved.

These and other objects, features, aspects and advantages of the present invention will become more apparent from the following detailed description of the present invention when taken in conjunction with the accompanying drawings.

Accordingly, an object of the present invention is to offer an IC card which would not be deformed, and hence, which maintains its quality reliability.

DESCRIPTION OF THE PREFERRED EMBODIMENTS

The present invention will be described below in relation to FIGS. 4 to 7 illustrating a first preferred embodiment.

Figure 1:
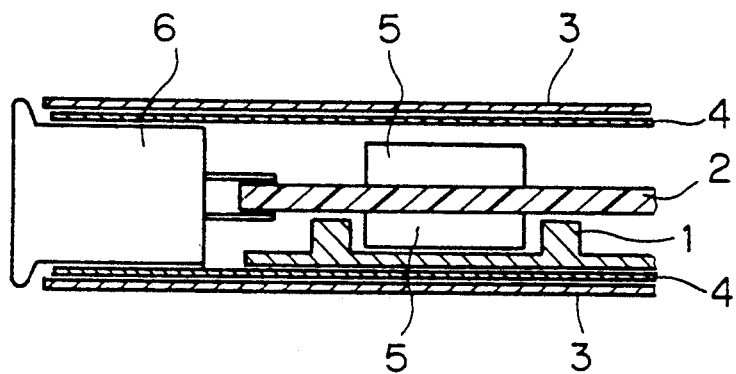
FIG. 1 is a cross sectional view taken in the line IV—IV of FIG. 2.
Figure 2:
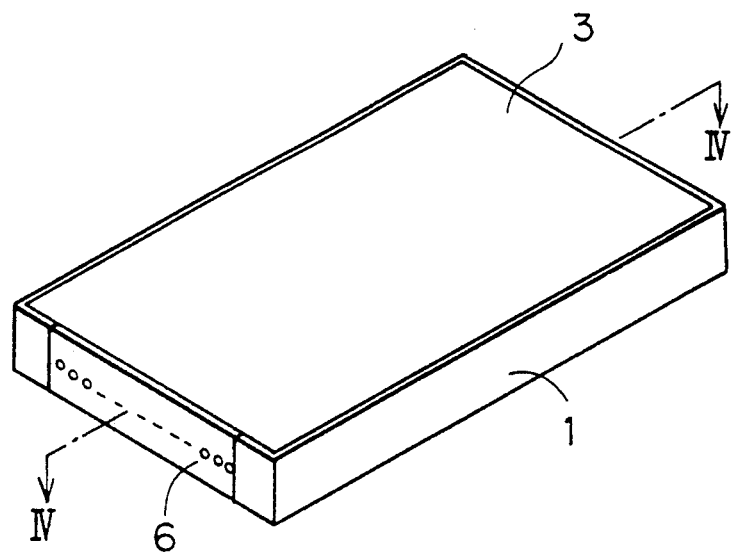
FIG. 2 is a perspective view of a conventional IC card.
Figure 3:
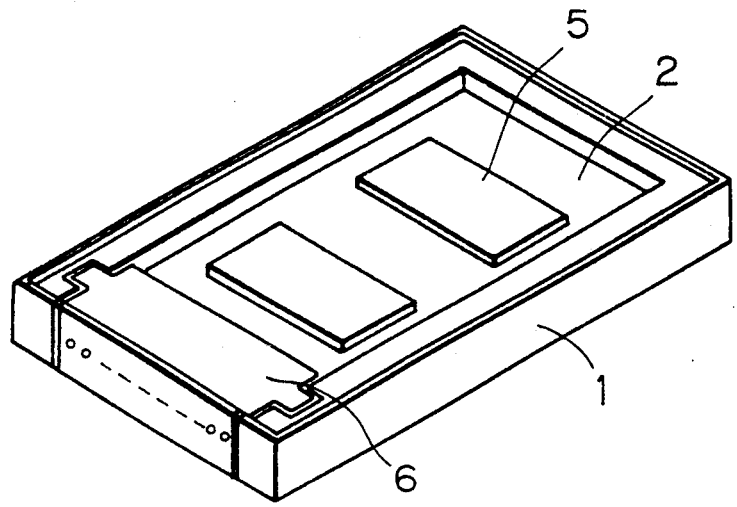
FIG. 3 is a perspective view showing inner structure of the conventional IC card.
Figure 4:
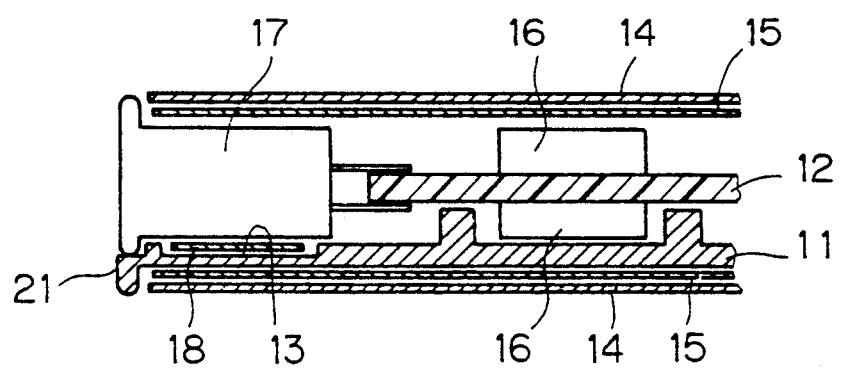
FIG. 4 is a cross sectional view taken in the line I—I of FIG. 5.
Figure 5:
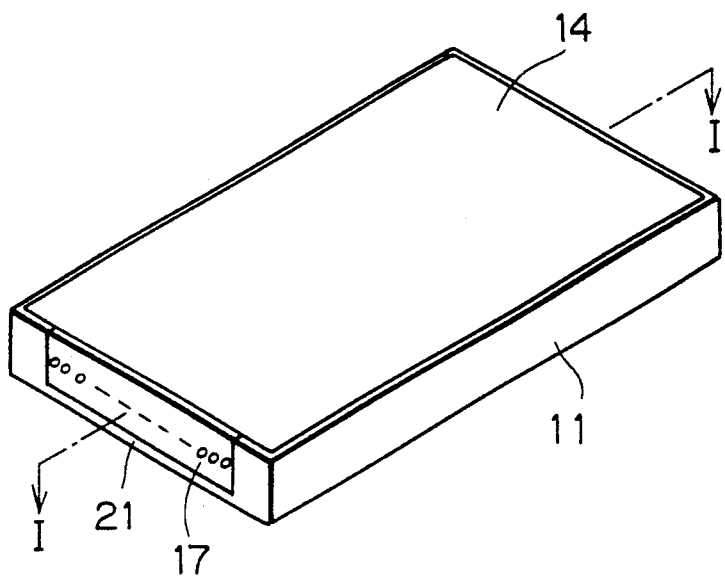
FIG. 5 is a perspective view of an IC card according to a first preferred embodiment of the present invention.
Figure 6:
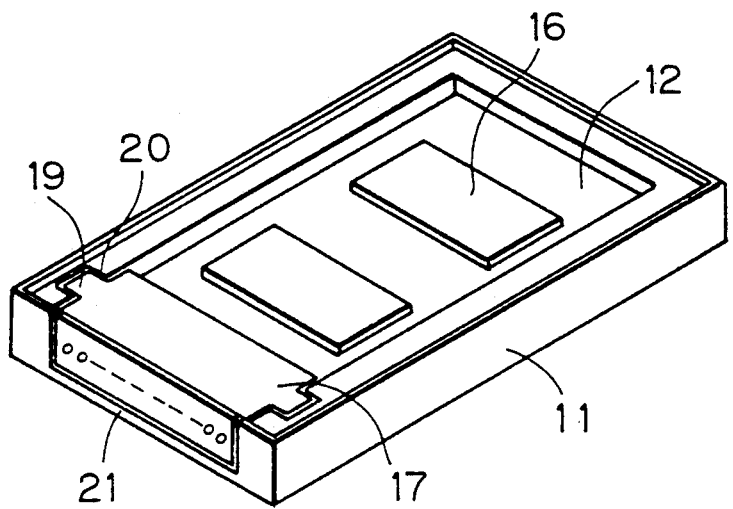
FIGS. 6 and 7 are a perspective view and an exploded view, respectively, showing inner structure of the IC card of the first preferred embodiment of the present invention.
Figure 7:
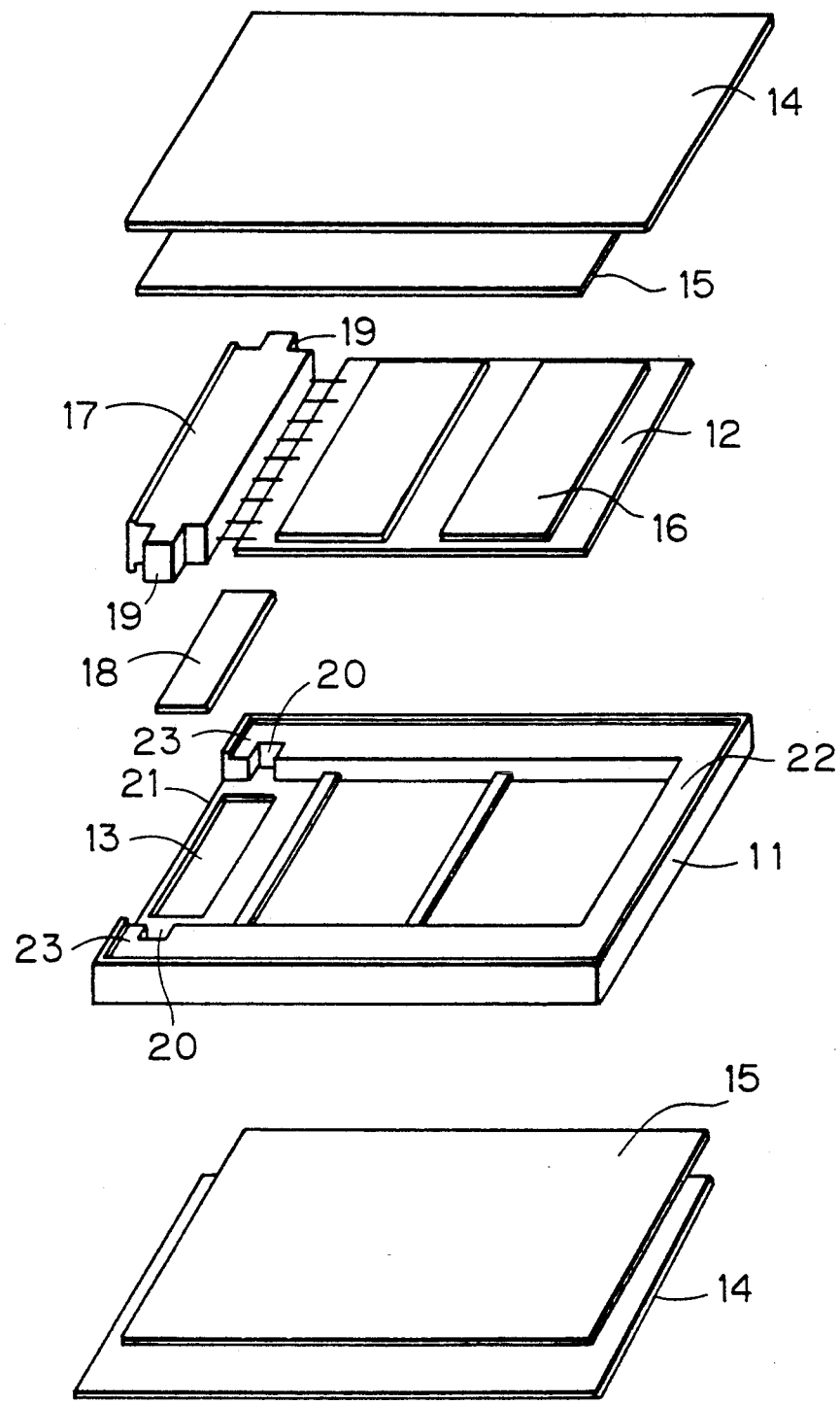

FIG. 4 is a cross sectional view taken in the line I—I of FIG. 5 which shows a perspective of an IC card according to the first preferred embodiment of the present invention. FIGS. 6 and 7 are a perspective view and an exploded view, respectively, showing the inner structure of the IC card. A frame formed in a lidless box like shape is indicated at 11 which houses a circuit substrate 12 for mounting ICs (i.e., electrical parts). The frame 11 includes a closed-side portion 22 and an open-side portion 23. In a lower portion of the open-side portion 23, an adhesive material supporting member 21 is disposed which has a recessed portion 13 in which an adhesive sheet 18, a second adhesive material layer, is to be placed. Indicated at 14 are metallic panels disposed to face the circuit substrate 12. The metallic panels 14 are fixed to the frame 11 by adhesive sheets 15, or first adhesive material layers. ICs 16 mounted to the both surfaces of the circuit substrate 12 are protected by the metallic panels 14 against environmental disturbances from outside. A connector 17 of the two piece type, for example, is connected to the circuit substrate 12. The connector 17 has projections 19 on its opposed side walls. The projections 19 engage with recesses 20 provided in the open-side portion 23 of the frame 11. The connector 17 is fixed to the frame 11 by the adhesive sheet 18 (the second adhesive material layer).

In this IC card, since the connector 17 is fixed to the frame by the adhesive sheet 18, or the second adhesive material layer, external force which acts on the connector 17 at insertion and detachment of the IC card into and from external equipment would not act on the adhesive sheets 15 (i.e., the first adhesive material layers).

Hence, insertion and detachment of the IC card do not invite deterioration in the adhesion between the panels 14 and the frame 11. Thus, deformation of the IC card is prevented.

Although the foregoing has described that the two-piece type connector 17 is used in the IC card, the present invention is not limited to as such. Instead, other types of connectors may be used.

In addition, the ICs 16 are described as mounted to the both surfaces of the circuit substrate 12. However, the IC card of the present invention may include ICs 16 mounted on only one surface of the circuit substrate 12.

According to the first preferred embodiment, the frame 11 has a configuration like a lidless box with a bottom. However, the frame 11 alternatively has a box like shape without a lid and a part of a bottom, in which case, too, the circuit substrate 12 mounting ICs 16 is protected by the panels 14.

Figure 8:
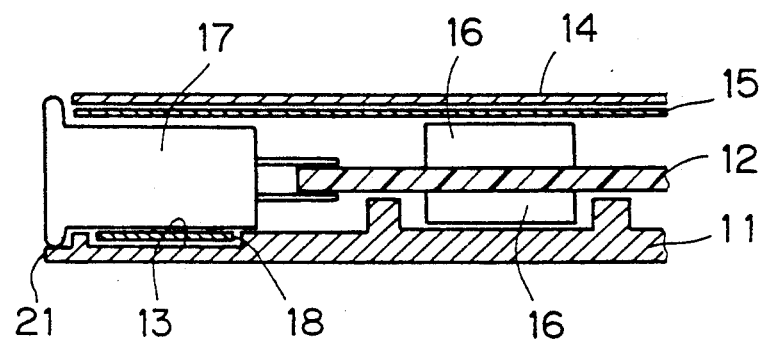
FIG. 8 is a cross sectional view of an IC card according to a second preferred embodiment of the present invention.

FIG. 8 shows the IC card of the present invention as including only one panel 14 for protecting the circuit substrate 12 (second preferred embodiment). In FIG. 8, elements similar to those previously described with reference to FIGS. 4 to 7 are denoted by the same reference numerals. As shown in FIG. 8, since a bottom surface of the frame 11 protects the circuit substrate 12, the panel 14 in the bottom side of the frame 11 is simply omitted. Thus, using a smaller number of panels as compared with the first preferred embodiment, the second preferred embodiment attains less complex fabrication of the IC card.

Needless to mention, the number of the ICs 16, the configurations of the elements such as the frame 11 and the material of the panels 14 are not limited to as heretofore disclosed.

The IC card of the present invention is used in the same manner as the conventional IC card. That is, the IC card is inserted into and detached from external equipment (not shown).

While the invention has been shown and described in detail, the foregoing description is in all aspects illustrative and not restrictive. It is understood that numerous modifications and variations can be devised without departing from the scope of the invention.

We claim:
1. An IC card, comprising:
   (a) a substrate for mounting ICs:
   (b) a frame for housing said substrate, said frame comprising an open-side portion and a closed-side portion;
   (c) two panels for protecting said substrate from two sides, said two panels being fixed to said frame by first adhesive material layers;
   (d) a connector disposed inside said open-side portion and between said two panels, a front end of said connector being exposed outside of said IC card, a rear end of said connector being connected to said substrate within said IC card; and
   (e) a second adhesive material layer which is separated from said first adhesive material layers, for fixing said connector to said frame.

2. The IC card of claim 1, wherein ICs are mounted to the both surfaces of said substrate.

3. The IC card of claim 2, wherein said frame has, in a lower portion of said open-side portion, an adhesive material supporting member for supporting said second adhesive material layer.

4. The IC card of claim 3, wherein said adhesive material supporting member has a recessed portion in which said second adhesive material layer is to be placed.

5. The IC card of claim 4, wherein said connector has projections, said open-side portion has recesses, and said projections are engaged with said recesses.

6. The IC card of claim 5, wherein said connector comprises a detachable engagement type connector.

* * * * *

UNITED STATES PATENT AND TRADEMARK OFFICE
CERTIFICATE OF CORRECTION

PATENT NO. : 5,299,940
DATED : April 5, 1994
INVENTOR(S) : Takeshi UENAKA et al.

It is certified that error appears in the above-indentified patent and that said Letters Patent is hereby corrected as shown below:

On the title page, Item [75], the 1st inventor's city should read --Sanda City-- and the 3rd inventor's first name should read --Yasunori--.

Signed and Sealed this

Twelfth Day of July, 1994

Attest:

BRUCE LEHMAN

*Attesting Officer*     *Commissioner of Patents and Trademarks*